United States Patent
Lavallee et al.

(10) Patent No.: US 6,919,164 B2
(45) Date of Patent: Jul. 19, 2005

(54) PATTERNING COMPOSITIONS USING E-BEAM LITHOGRAPHY AND STRUCTURES AND DEVICES MADE THEREBY

(75) Inventors: Guy P. Lavallee, State College, PA (US); Jeffrey M. Catchmark, Bellefonte, PA (US); Youngchul Lee, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 165 days.

(21) Appl. No.: 10/164,841

(22) Filed: Jun. 7, 2002

(65) Prior Publication Data

US 2003/0087191 A1 May 8, 2003

Related U.S. Application Data

(60) Provisional application No. 60/296,809, filed on Jun. 8, 2001.

(51) Int. Cl.[7] ................................................. G03C 5/00
(52) U.S. Cl. ........................ 430/296; 430/320; 430/321; 430/942
(58) Field of Search .................................. 430/296, 320, 430/321, 942

(56) References Cited

U.S. PATENT DOCUMENTS

| | | | |
|---|---|---|---|
| 4,548,893 A | * 10/1985 | Lee et al. ................... | 430/296 |
| 4,724,260 A | 2/1988 | Kirchhoff et al. ........... | 546/112 |
| 4,812,588 A | 3/1989 | Schrock ..................... | 556/453 |
| 5,136,069 A | 8/1992 | De Vries et al. ............ | 556/453 |
| 5,138,081 A | 8/1992 | De Vries et al. ............ | 556/466 |
| 5,264,646 A | 11/1993 | De Vries et al. ............ | 585/641 |
| 5,585,225 A | 12/1996 | Audett et al. ............... | 430/323 |
| 5,882,836 A | * 3/1999 | Foster et al. ................ | 430/194 |
| 6,083,661 A | 7/2000 | Oaks et al. ............... | 430/286.1 |

* cited by examiner

*Primary Examiner*—Christopher G. Young
(74) *Attorney, Agent, or Firm*—Ohlandt, Greeley, Ruggiero & Perle L.L.P.

(57) ABSTRACT

A method of patterning a layer of e-beam sensitive dielectric material, such as bisbenzocyclobutene monomers, using electron beam lithography.

29 Claims, 2 Drawing Sheets

PATTERNING COMPOSITIONS USING E-BEAM LITHOGRAPHY AND STRUCTURES AND DEVICES MADE THEREBY

This application claims priority from U.S. Provisional Application No. 60/296,809, filed Jun. 8, 2001

BACKGROUND OF THE INVENTION

1. Field of the Invention

The present invention relates to a novel production method for optic, optoelectric, and microelectronic structures and devices. More particularly, the present invention relates to a method of patterning photosensitive polymeric dielectric compositions using electron beam lithography.

2. Description of the Prior Art

Processes for accurately and routinely patterning submicron features in a variety of materials are critical for the future of a wide range of devices and structures for applications in areas ranging from biological substrates to electronic, optoelectronic and molecular devices to Micro Electro-Mechanical Systems (MEMS) structures. Depending on the specific application, the material being patterned may be just as critical, since its electrical, thermal, optical and physical characteristics may ultimately determine its viability.

In addition, nano-scale devices are the topic of intense research and development for a variety of electronic, optoelectronic and biological applications. In the optical/optoelectronic area, structures such as 2 and 3 dimensional artificial photonic crystals can exhibit a wide range of useful and unique characteristics, which can be used to develop many important devices for commercial applications. Nano-scale Electro Mechanical Systems (NEMS) are another important example of 3 dimensional structures, which have great commercial potential in areas ranging from sensors to optoelectronics to biological applications. In the electronics arena, nano-scale devices offer the potential for a significant increase in the density of fabricated devices and related circuits, improved operating characteristics, and exhibiting entirely new behavior. Specific examples include molecular devices, such as molecular transistors, which may be fabricated in densities far exceeding those attainable via currently used processes, such as those used to fabricate DRAM memory elements.

Another very important matter is the substrate on which molecular devices, or other nano-scale devices, can be fabricated. Although silicon is the substrate material currently used to manufacture most electrical semiconductor devices today, emerging organic-based device technologies may allow nano-scale devices to be fabricated on other materials, including polymers. These technologies may have a significant impact on, for example, the biological, pharmaceutical and display industries.

In the electronics arena, given the current focus on substantially reducing the size of devices, as well as developing device technologies which are compatible with a variety of materials and applications, a robust multi-level interconnect process may ultimately determine the level of integration achievable for electronic circuit applications. Interconnects not only connect devices to the 'outside world' but also serve as the electronic pathways for sending signals from one device to a neighboring device or to many devices located physically on the other side of an integrated circuit. If new technologies allow devices to be reduced in size to <100 nm, then the interconnect system may ultimately limit how small a circuit using these devices can be made.

Of course, a multi-level interconnect system is just one example of a general 3 dimensional metallic structure. As mentioned above, other devices, such as 2 dimensional gratings, 2 and 3 dimensional artificial photonic crystals and NEMS may have many important commercial applications, but their fabrication process remains challenging and complex.

One excellent material currently being used to fabricate electrical interconnects (but could be used to fabricate a variety of 3 dimensional and other structures) is a bisbenzocyclobutene derived composition available commercially as CYCLOTENE® from The Dow Chemical Company. CYCLOTENE® resins are high-purity polymer materials that have been developed specifically for microelectronics applications. The resins are derived from B-staged bisbenzocyclobutene (BCB) monomers and are formulated as high-solids, low-viscosity solutions. This material has been used in photolithography applications and is exceptional electrically, as it exhibits a low dielectric constant (approximately 2.6, much better than Silicon Dioxide, which has a dielectric constant of 3.9), making it ideal for high frequency electronic circuit applications. It also exhibits a very high resistivity ($1 \times 10^{19}$ ohm-cm) and a low dissipation factor (0.0008 at 1 kHz–1 MHz). Bisbenzocyclobutene also has other desirable physical and optical characteristics. Excellent planarization characteristics can be obtained with typical deposition processes (greater than 80% planarization for height variations greater than 1 $\mu$m easily achievable). In addition, the material is transparent in the infrared region, which may enhance its usefulness to biological and sensor applications.

In addition to the desirable material characteristics discussed above, bisbenzocyclobutene also has other desirable characteristics making it particularly attractive for certain device fabrication processes. This material is resistant to many wet and plasma based etch chemistries, making it suitable for masking and other process steps.

Currently, there are only two known approaches for patterning bisbenzocyclobutene. One approach is to deposit the material and then use another material which can be patterned (typically a polymer known as a resist, which is used extensively in the semiconductor processing industry) which serves as a mask for etching the bisbenzocyclobutene. This process may be quite difficult depending upon several factors including thickness of the bisbenzocyclobutene, feature size of the mask and the available etch processes and resists.

The most direct approach, however, is to use a photosensitive version of bisbenzocyclobutene. In this case, the patterning of the material is accomplished using a process very similar to those used for typical resists implemented in the semiconductor processing industry. In this case, ultraviolet light is used to modify the physical and/or chemical properties of the material to make the material more or less susceptible to removal via another chemical referred to as a developer. This process is typically referred to as optical lithography. In particular, exposure to ultraviolet light changes a positive resist from polymerized to unpolymerized and a negative resist from unpolymerized to polymerized. The polymerization process causes the resist to become a cross-linked material, which cannot be removed using a developer. In a negative working resist composition, the light struck areas form the image areas of the resist after removal of the unexposed areas with a developer. In a positive working resist the exposed areas are the non-image areas. The photosensitive version of bisbenzocyclobutene behaves like a negative resist since exposure to ultraviolet light causes the material to convert from an unpolymerized to a polymerized state.

One critical issue with this (and any) approach to patterning materials is the ultimate resolution achievable for a given process, i.e., how small a feature of the material can be patterned. In the case of optical lithography, the ultimate resolution is typically related to the wavelength of the ultraviolet light used for exposure. The smaller the wavelength of light used, the better the achievable resolution. Thus optical lithography limits the attainable feature size since it relies on ultraviolet light to pattern the material.

In order to fabricate structures with smaller feature sizes, other lithographic processes have been developed. In particular, processes using electron beams in place of ultraviolet light have been developed since electron beams can be generated and controlled with a resolution of approximately 2–10 nm, far exceeding the resolution attainable using conventional optical lithography. Of course, to exploit the resolution achievable via electron beams, resists sensitive to electrons instead of light have been developed. Currently available resists exhibit good resolution, but have several drawbacks. They typically have poor resistance to plasma based etching and cannot typically be used as a permanent part of a device structure, i.e., they are used to pattern a material but then are removed. There are many applications, such as the fabrication of multi-layer nano-scale interconnect architectures for electrical, optical and, in particular, molecular devices, which would substantially benefit from a process for patterning more suitable materials on the nanoscale, which exhibited superior material or process-related characteristics.

In addition, the dose required to properly expose an e-beam resist can be relatively significant, on the order of 300 to 900 micro Coulombs per square centimeter. An electron beam resist which required a lower dose for exposure could substantially reduce the time required to pattern a sample, lowering the cost of e-beam lithography and increasing the number of wafers patterned in a given period of time. It would be highly advantageous to remedy the foregoing and other deficiencies discussed above.

A further object of the present invention is to provide a method for fabricating multi-level nano-scale interconnect systems.

SUMMARY OF THE INVENTION

The present invention is directed to a method for improving the production of microelectronic structures and devices. Applicants have unexpectedly discovered that certain polymeric dielectric compositions (e.g., those derived from bisbenzocyclobutene (BCB) type compounds) can be patterned using electron-beam (e-beam) lithography. Materials suitable for e-beam patterning comprise monomers, oligomers, polymers and any combinations thereof. Dielectric materials are preferred embodiments of the invention. This process uses the interaction of accelerated electrons with the dielectric to convert it to a more polymerized or cross-linked state with much better resolution than that attainable via ultraviolet light based processes. Applicants have also unexpectedly discovered that once BCB is cured, no significant further patterning using e-beam is possible. Both of these discoveries lead to improved microelectronic devices and methods.

The present invention is also directed to a lithographic method of producing a patterned layer on a substrate comprising: applying onto a substrate an e-beam sensitive composition to produce an e-beam sensitive coating on the substrate; patternwise exposing the coating with an electron beam to produce a coating having exposed and unexposed regions; contacting a developer and the coating having exposed and unexposed regions to selectively remove the unexposed regions to produce a patterned layer; and optionally repeating the method.

Also, the present invention relates to microelectronic, optical, or optoelectronic apparatuses having at least one patterned layer on a substrate wherein the patterned layer is produced by a method comprising: applying onto a substrate an e-beam sensitive composition to produce an e-beam sensitive coating on the substrate; patternwise exposing said coating with an electron beam to produce a coating having exposed and unexposed regions; contacting a developer and said coating having exposed and unexposed regions to selectively remove said unexposed regions to produce a patterned layer; and optionally repeating said method.

The aforementioned process, in conjunction with other process steps, can be used to fabricate a variety of 3 dimensional nano-scale structures. For example, a multi-level nano-scale interconnect process can be developed, which can be used in a variety of applications ranging from current silicon based electronic integrated circuits to interconnection of future molecular electronic devices fabricated on plastic for biological sensor applications. Suitable substrates may be selected from the group consisting of: semiconductors, glasses, plastics, polymers, metals ceramics, insulators, organic materials, inorganic materials, or any combinations thereof. This is an example where the resulting 3 dimensional structure is composed of the dielectric polymer (e.g., bisbenzocyclobutene derived compositions) and some metal, but other materials may be used, including silicon dioxide, silicon nitride or other polymers.

Other features and advantages of the present invention will be apparent from the following detailed description, and from the claims.

DETAILED DESCRIPTION OF THE INVENTION

Figure 1:
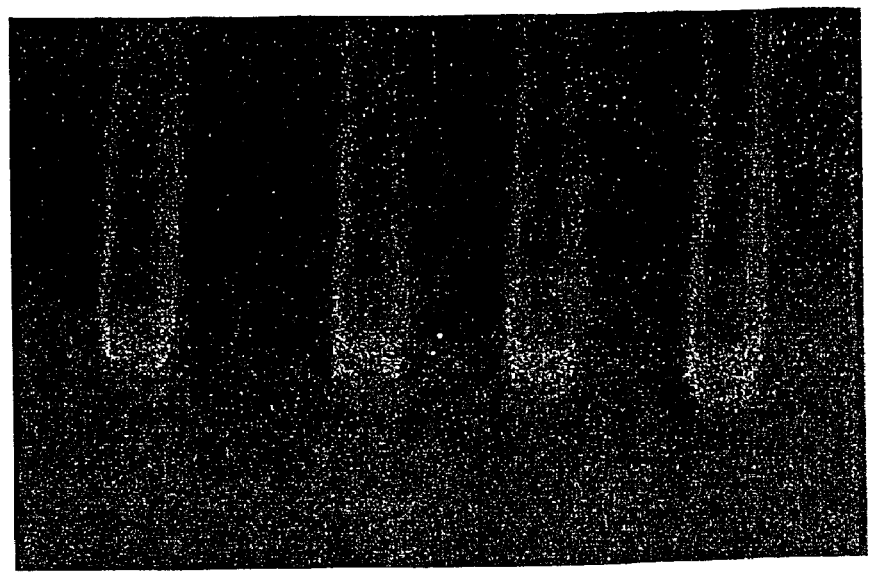
FIG. 1 is a SEM image that shows ~300 nm lines patterned using the following parameters: 50 keV, 32 $\mu$C pattern, 400 nm thick BCB.
Figure 2:
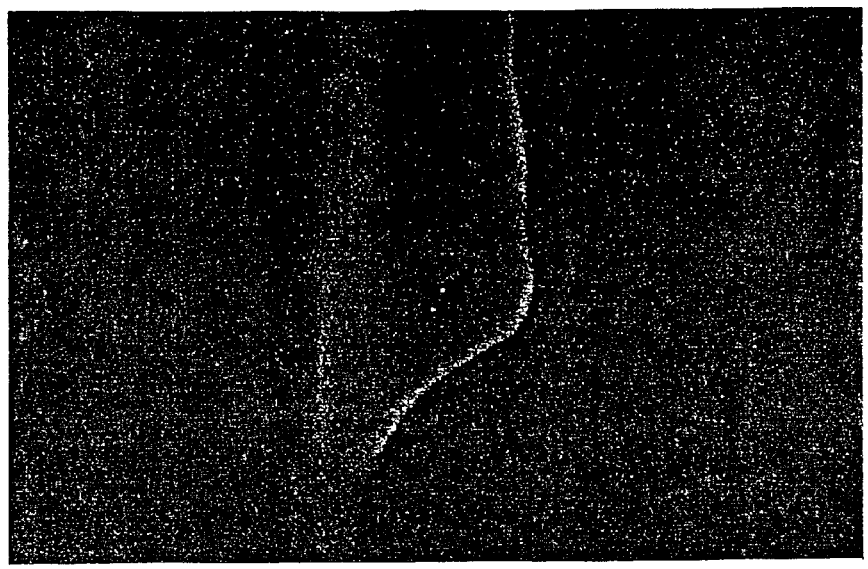
FIG. 2 is a SEM image that shows an approximately 50 nm line patterned using the following parameters: 50 keV, 32 $\mu$C pattern, 400 nm thick BCB.

The present invention is a unique process of patterning a dielectric polymer material (e.g., preferred, but not necessarily limited to material derived from a bisbenzocyclobutene monomer) using e-beam lithography, allowing nano-scale structures, such as interconnects to be fabricated. It exploits a novel property we first discovered in a bisbenzocyclobutene dielectric. We have found experimentally that this material can only be patterned using e-beam lithography when it is in an uncured state. Once cured, the material is no longer sensitive to exposure to accelerated electrons. The invention is best understood by way of the following detailed description and the examples given below.

The dielectric polymers useful in the present invention are those photosensitive polymers capable of being patterned using electron-beam lithography. Dielectric materials are those substances that are poor conducts of electricity, but an efficient support of electrostatic fields. A particular family of useful compositions are the cyclobutarenes described in U.S. Pat. No. 6,083,661 to Oaks et al. hereby incorporated by reference. More specifically, those compositions obtained from bisbenzocyclobutene monomers are especially preferred. These compounds are often bridged by organopolysiloxane (e.g., divinyltetramethyldisiloxane). They can be prepared by methods disclosed in U.S. Pat. Nos. 4,724,260; 4,812,588; 5,136,069; 5,138,081; and 5,264,646. These patents are hereby incorporated by reference. Preferred compositions are photo-curable, organic-soluble mixtures comprising at least one oligomerized cyclobutarene made from a cyclobutarene monomer as its major component and at least one photosensitive agent in an amount sufficient to convert the mixture to a polymer insoluble in a development solvent upon exposing the mixture to ultraviolet or visible light. A preferred photosensitive agent is a poly(aryl azide), such as 2,6,-bis(4-azidobenzylidene)-4-alkylcyclohexanone or 2,6,-bis(4-azidobenzylidene)-methylcyclohexanone. Such mixtures may also contain an antioxidant, such as an antioxidant derived from 1,2-dihydro-2,2,4-trimethyquinoline. Particularly preferred compounds were obtained from The Dow Chemical Company and are known as CYCLOTENE®.

The present invention requires a low K dielectric material capable of patterning with an e-beam. Preferred materials are products available commercially from The Dow Chemical Company as a product line referred to as SiLK (Silicon Low K dielectrics). There are divisions of this product line, including non-photosensitive spin-on dielectric materials. The photosensitive CYCLOTENE® 4000 series was used as a preferred embodiment of the present invention.

Cyclotene (i.e., 4022 PBCB manufactured by Dow Chemical Co. of Midland, Mich.) is a composition typically comprising: 26–44% B-staged divinylsiloxane-bisbenzocyclobutene, 50–73% mesitylene, 0.3–3.1% polymerized 1,2-dihydro-2,2,4-trimethylquinoline and 0.3–2.7% of 2,6-bis {(4-azidophenyl) methylene}-4-ethylcyclohexanone. The other variations of the 4000 series Cyclotene products contain variations in the relative concentrations of the above compounds.

The present invention is further illustrated by the following Examples which are intended for illustration and not for limitation of the scope thereof.

EXAMPLE 1

Patterning BCB Using E-Beam Lithography

In order to determine if photosensitive BCB (PBCB) could be used for e-beam lithography we applied DOW's 4022 PBCB to a silicon wafer and performed a dose array. The 4022 BCB is identical to the other 4000 series BCB compositions except for the level of dilution, which impacts the thickness at a given spin speed during deposition.

A dose array is an array of patterns written onto a material using an electron beam at different dose levels. The dose relates to the number of electrons the material is exposed to. These electrons are driven into the sample via an accelerating voltage, which can be either 20 keV, 50 keV or 100 keV. Other e-beam lithography tools may have other accelerating voltage options. The dose and accelerating voltage impact the final feature resolution and overall shape of the pattern on the nm scale.

Upon completion of the dose array we developed the sample using the standard procedure from DOW. The development process consists of the following steps. After exposure the substrate is soft baked on a hot plate for 30 seconds. The temperature of the pre-development bake should be 10° C. lower than the pre-exposure bake of 70° C. This pre-development bake must be carried out immediately before developing. Upon completion of the pre-development bake the wafer is placed on the chuck of the spin coater or wafer track and DS2100 is dispensed on the substrate. Sufficient developer is applied to completely cover the substrate. The substrate is allowed to sit with the developer on it for 150% of the end point time (end point is the time where no colored interference fringing patterns rippling across the wafer are present). After reaching the 150% end point time the wafer is spun at 500 RPM for 10 seconds while dispensing a stream of DS2100 on the center of the substrate. Following the rinse the substrate is spun at 3000–4000 RPM for 30 seconds to remove the developer and allow the substrate to dry. (Note: if a pre-development bake is not used the development time is reduced to 130% of the end point time.)

Upon completion of the development a pattern was seen. However, due to the thickness of the PBCB the pattern was not fully transferred, i.e., some of the material which was to be removed during development was not completely removed. This prevented the pattern from extending to the surface of the substrate as is necessary for a useful resist. Several factors can impact the final pattern generated using e-beam lithography. One important aspect is the thickness of the resist layer. In order for photosensitive BCB (PBCB) to be patterned on the sub micron level, it had to be modified to allow it to be applied at a thickness of less than 400 nm. Currently, the thinnest layer that can be spun using the lowest viscosity PBCB (4022: viscosity 195 cSt) is approximately 2.5 microns. In order to spin on thinner layers, the PBCB must be thinned using a solvent. In the present invention, the thickness of the photosensitive dielectric layer is less than about 1 micron, preferably less than about 500 nm and most preferably less than about 100 nm.

EXAMPLE 2

PBCB Dilution

The following procedure outlines the process for thinning the PBCB in order to make it a viable e-beam resist.

Using 1,3,5 trimethylbenzene (mesitylene) as the solvent, we diluted the 4022 PBCB to a ratio of 4:1 (mesitylene:4022). This is only one dilution of PBCB used. Other dilutions of PBCB were examined including 6:1 (mesitylene:4022). The larger the ratio of mesitylene to 4022 PBCB, the thinner the PBCB could be applied. Application is typically performed via (but not limited to) a spinning process as is common in the semiconductor fabrication industry. Higher spin speeds also produce thinner PBCB layers.

Application of Diluted PBCB (D-PBCB):

1. Apply DOW's AP3000 adhesion promoter (i.e., 98% 1-methoxy-2-propanol, less than 1% water, etc.) statically to cover the wafer.
2. Spin wafer at 3000 rpm for 20–30 seconds or until dry.
3. Reduce speed of wafer to 500 rpm.
4. Slowly apply diluted PBCB to wafer.
5. Let wafer spin for extra 10 seconds after application of D-PBCB.
6. Slowly ramp wafer up to 4000–7000 rpm and let spin for 45 seconds.
7. Post Application Bake (PAB) at 90° C. for 5 minutes.

Post Exposure Bake and Development:

1. Post Exposure Bake (PEB) at 90° C. for 20 seconds.

2. Apply DOW's DS2000 (i.e., 30–35% dipropylene glycol dimethyl ether and 65–70% naphtha, petroleum, hydrotreated heavy) statically to cover the wafers and wait for end point detection (EPD).
3. Spin wafer at 500 rpm.
4. Apply two more ml of DS2000.
5. Ramp to 3000 rpm and let spin for 45–50 seconds.

We have also explored other development processes which include a longer static development (30 sec to 2 min develop time after end-point detection) and exclude the application of the two additional ml of DS2000. In some cases, this process provided better feature development. In addition, slower spin speed than that typically recommended by Dow in step 4 and/or step 5 above have also in some cases provided improvement in feature development.

Curing on Hot Plate:
1. Set temperature of hot plate to 110° C.
2. Place sample on hot plate for 10 minutes.
3. Ramp hot plate temperature to 130° C. over 5 minutes while sample is on hot plate.
4. Let sample sit at 130° C. for 10 minutes.
5. Ramp hot plate temperature to 160° C. over 5 minutes while sample is on hot plate.
6. Let sample sit at 160° C. for 10 minutes.
7. Ramp hot plate temperature to 190° C. over 5 minutes while sample is on hot plate.
8. Let sample sit at 190° C. for 10 minutes.
9. Ramp hot plate temperature to 220° C. over 5 minutes while sample is on hot plate.
10. Let sample sit at 220° C. for 30 minutes.

were performed. These were written using the Leica EBPG5-HR e-beam at the Penn State Nanofab. The e-beam was set to 50 keV, 25 nm spot size. The doses were written with both 400 micron and 600 micron apertures. The dose arrays ranged from 30 to 350 micro coulombs. Preliminary results show that the lower doses (approximately 30 micro coulombs) produce the best results. The dose arrays were written 4 times per wafer in separate areas. This enabled subsequent characterization of the development. The lower dose exposures required to develop the PBCB offers a significant advantage over most currently available resists, which require 300–900 micro coulomb exposures. These longer exposures can significantly increase the e-beam write time required to pattern a wafer. In the present invention, the exposure is less than about 300 micro coulomb, preferably less than about 100 micro coulomb, and most preferably less than about 50 micro coulomb.

Development of the exposed resist was carried out in several steps. The first step was to examine the effect of a post exposure bake (PEB) on the quality of the exposed pattern. In order to perform this test a wafer that was written was cleaved into four quarters (each having the same dose array). One quarter was developed after a PEB, which was at 90° C. for 20 seconds. The other quarter had no PEB before development. Preliminary results show no difference in the quality of the exposed pattern between the two methods.

The following tables describe exposure and development experiments which have been performed.

TABLE 1

(Exposure Matrix)

| Dose Array ($\mu$C) | BCB Thickness (nm) | keV | Aperture ($\mu$m) | Spot Size (nm) | Beam Current (nA) | Comments | Minimum Feature Size |
|---|---|---|---|---|---|---|---|
| 30-375 | 400 | 50 | 600 | 60 | .122 | Low Dose: Good; High Dose: Poor | 150 nm |
| 30-50 | 400 | 50 | 400 | 25 | .505 | All Good; Low Dose Better | ~50 nm |
| 20-75 | 180 | 100 | 200 | 25 | | | |
| 40-130 | 20 | 100 | 200 | 25 | | | |

Using the procedure outlined above we then ran the same dose array on the D-PBCB. After developing the sample the pattern was fully transferred onto the wafer.

EXAMPLE 3

Characterization of the Patterned D-PBCB

Once it was shown that the PBCB was e-beam sensitive it was then necessary to determine the optimal thickness and dose for patterning. Both of these parameters depend on the size and density of the features that are trying to be written. Once a determination is made on feature size and feature density the appropriate thickness can be chosen. In this case, features of 25 to 100 nm were desired. In order to pattern such features different thickness DPBCB were spun on (1 micron, 400 nm, 180 nm, 20 nm). These different thicknesses were achieved by performing different (mesitylene:4022) dilutions and by varying the applied spin speed. Next, dose arrays on each of the different thickness

TABLE 2

Development Matrix (development process)

| Sample (keV-dose-#) | PEB | PEB Temp (° C.) | Developer | Static Development Time (sec) | Dynamic Development (mL) | Dry Time (sec) |
|---|---|---|---|---|---|---|
| 50-(30-50)-1 | No | | DS-2100 | 20 | 2 | 45 |
| 50-(30-50)-2 | Yes | 90 | DS-2100 | 35 | 2 | 45 |
| 50-(30-50)-3 | Yes | 90 | DS-3100 | 360 | 0 | 45 |
| 50-(30-50)-4 | Yes | 90 | DS-2100 | 20 | 0 | 45 |
| 50-(30-375)-1 | Yes | 90 | DS-2100 | 20 | 2 | 45 |
| 50-(30-375)-2 | Yes | 90 | DS-2100 | 45 | 2 | 45 |
| 50-(30-375)-3 | Yes | 90 | DS-2100 | 60 | 2 | 45 |
| 50-(30-375)-4 | No | 90 | DS-2100 | 35 | 0 | 45 |

EXAMPLE 4

3-Level Nano-Interconnect

Using bisbenzocyclobutene and the process described above for patterning this material using e-beam lithography, we have developed a process for fabricating 3 dimensional metallic structures (other non-metallic structures can be fabricated using this process). The specific process below can be implemented to fabricate multi-level nano-scale electrical interconnects. The interconnect metal can be any metal, such as gold or copper, which can be plated or evaporated, depending upon the desired application. We could use this general process to fabricate an 8–10 level interconnect system, for example. The ultimate number of levels attainable is limited to the state of the practice of implementing this process in a production environment, in addition to the desired size and spacing of the interconnect lines.

TABLE 3

(A 3-level nano-interconnect process)

| | Sample 3-level Nano-interconnect Process | | JMC/GPL | |
|---|---|---|---|---|
| Step 1 | Interconnect Metal - Level 1 | Pattern resist for first metal (for lift-off process - other processes could be used) | eMask 1 | eMask means an electronic mask file used by the e-beam system to write a pattern. |
| Step 2 | | Deposit metal | | |
| Step 3 | | Strip resist (lift-off) | | |
| Step 4 | Dielectric 1 | Spin on BCB | | BCB is bisbenzocyclobutene |
| Step 5 | Via 1 | soft bake | | |
| Step 6 | | Write pattern on BCB | eMask 2 | |
| Step 7 | | develop | | |
| Step 8 | | cure | | This BCB layer is now Insensitive to exposure to an Electron beam. |
| Step 9 | Interconnect Metal - Level 2 | Deposit seed metal | | |
| Step 10 | | Spin on BCB or resist | | |
| Step 11 | | soft bake | | |
| Step 12 | | Write pattern on BCB or resist | eMask 3 | This does not effect the first Layer of BCB. |
| Step 13 | | develop | | |
| Step 14 | | Plate to BCB height | | |
| Step 15 | | develop (remove BCB or resist) | | Note Second layer of BCB |
| Step 16 | | Strip seed metal | Never cured. This layer could Also be resist, as noted | |
| Step 17 | Dielectric 2 | Spin on BCB | | |
| Step 18 | Via 2 | soft bake | | |
| Step 19 | | Write pattern on BCB | eMask 4 | |
| Step 20 | | develop | | |
| Step 21 | | cure | | |
| Step 22 | Interconnect Metal - Level 3 | Deposit seed metal | | |
| Step 23 | | Spin on BCB or resist | | |
| Step 24 | | soft bake | | |
| Step 25 | | write | eMask 5 | |
| Step 26 | | develop | | |
| Step 27 | | Plate to | | |

TABLE 3-continued (A 3-level nano-interconnect process)

| Sample 3-level Nano-interconnect Process | JMC/GPL |
|---|---|
| Step 28 | BCB height develop (remove BCB or resist) |
| Step 29 | Strip seed metal |

EXAMPLE 6

Impact of Developer

We examined one additional parameter, which was the impact of not depositing the developer dynamically after end-point detection as is outlined in Dow's development process. The development process consists of the following steps. After exposure the substrate is soft baked on a hot plate for 30 seconds. The temperature of the pre-development bake should be 10° C. lower than the pre-exposure bake of 70° C. This pre-development bake must be carried out immediately before developing. Upon completion of the pre-development bake the wafer is placed on the chuck of the spin coater or wafer track and DS2100 is dispensed on the substrate. Sufficient developer is applied to completely cover the substrate. The substrate is allowed to sit with the developer on it for 150% of the end point time (end point is the time where no colored interference fringing patterns rippling across the wafer are present). After reaching the 150% end point time the wafer is spun at 500 RPM for 10 seconds while dispensing a stream of DS2100 on the center of the substrate. Following the rinse the substrate is spun at 3000–4000 RPM for 30 seconds to remove the developer and allow the substrate to dry. (Note: if a pre-development bake is not used the development time is reduced to 130% of the end point time.)

By eliminating this step, and extending the develop time after end-point detection, then spin-drying we were able to improve the characteristics of the developed lines.

While the invention has been particularly shown and described with reference to preferred embodiments thereof, it will be understood by those skilled in the art that various alterations in form and detail may be made therein without departing from the spirit and scope of the invention. In particular, optimization of parameters such as thickness of the dielectric layer, dose of the e-beam, etc. for any particular structures or devices can be determined by those skilled in the art.

Although the present invention describes in detail certain embodiments, it is understood that variations and modifications exist known to those skilled in the art that are within the invention. Accordingly, the present invention is intended to encompass all such alternatives, modifications and variations that are within the scope of the invention as set forth in the following claims.

What is claimed is:

1. A lithographic method of producing a patterned layer on a substrate comprising:

applying onto a substrate an e-beam sensitive composition, which is an e-beam curable, organic soluble mixture comprising at least one oligomerized cyclobutarene made from a cyclobutarene monomer bridged by organopolysiloxane and at least one photosensitive agent in an amount sufficient to convert said organic soluble mixture to an insoluble mixture upon exposing said mixture to electron beam to produce an e-beam sensitive coating on said substrate;

patternwise exposing said coating with an electron beam to produce a coating having exposed and unexposed regions; and contacting a developer and said coating having exposed and unexposed regions to selectively remove said unexposed regions to produce a patterned layer;

wherein said patterned layer is a nano-scale patterned layer; and wherein said electron beam dosage is less than about 300 microcoulombs.

2. The method of claim 1, wherein said substrate is selected from the group consisting of: semiconductors, glasses, plastics, polymers, metals, ceramics, insulators, organic materials, inorganic materials, and any combinations thereof.

3. The method of claim 1, wherein said e-beam sensitive composition is selected from the group consisting of: monomers, oligomers, and polymers and any combinations thereof.

4. The method of claim 1, wherein said e-beam sensitive composition is a dielectric composition.

5. The method of claim 4, wherein said dielectric composition is a dielectric polymer.

6. The method of claim 1, wherein said oganopolysiloxane is divinyltetramethydisiloxane.

7. The method of claim 1, wherein said photosensitive agent is a poly(aryl azide).

8. The method of claim 7, wherein said photosensitive agent is 2,6-bis(4-azidobensylidene)-4-alkylcyclohexanone.

9. The method of claim 7, wherein said photosensitive agent is 2,6-bis(4-azidobenzylidene)-4-methylcyclohexanone.

10. The method of claim 1, wherein said mixture contains an antioxidant.

11. The method of claim 10, wherein said mixture contains an antioxidant derived form 1,2,dihydro-2,2,4-trimethyquinoline.

12. The method of claim 1, wherein said e-beam coating is less than about 500 nm.

13. The method of claim 1, wherein said contacting of developer and coating is effected at spin speeds of about 500 RPM or less.

14. The method of claim 1, further depositing on said substrate at least one material selected from the group consisting of: metals, silicon dioxide, silicon nitrides, polymers and mixtures thereof.

15. A microelectronic, optical, or optoelectronic apparatus having at least one patterned layer on a substrate wherein said patterned layer is produced by a method comprising:

applying onto a substrate an e-beam sensitive composition, which is an e-beam curable, organic soluble mixture comprising at least one oligomerized cyclobutarene made from a cyclobutarene monomer bridged by organopolysiloxane and at least one photosensitive agent in an amount sufficient to convert said organic soluble mixture to an insoluble mixture upon exposing said mixture to electron beam to produce an e-beam sensitive coating on said substrate;

patternwise exposing said coating with an electron beam to produce a coating having exposed and unexposed regions; and contacting a developer and said coating having exposed and unexposed regions to selectively remove said unexposed regions to produce a patterned layer;

wherein said patterned layer is a nano-scale patterned layer; and wherein said electron beam dosage is less than about 300 microcoulombs.

16. The apparatus of claim 15, wherein said substrate is selected from the group consisting of: semiconductors, glasses, plastics, polymers, metals, ceramics, insulators, organic materials, inorganic materials, and mixtures thereof.

17. The apparatus of claim 15, wherein said e-beam sensitive composition is selected from the group consisting of: monomers, oligomers, and polymers and mixtures thereof.

18. The apparatus of claim 15, wherein said e-beam sensitive composition is a dielectric composition.

19. The apparatus of claim 18, wherein said dielectric composition is a dielectric polymer.

20. The apparatus of claim 15, wherein said oganopolysiloxane is divinyltetramethydisiloxane.

21. The apparatus of claim 15, wherein said photosensitive agent is a poly(aryl azide).

22. The apparatus of claim 21, wherein said photosensitive agent is 2,6-bis(4-azidobensylidene)-4-alkylcyclohexanone.

23. The apparatus of claim 21, wherein said photosensitive agent is 2,6-bis(4-azidobenzylidene)-4-methylcyclohexanone.

24. The apparatus of claim 15, wherein said mixture contains an antioxidant.

25. The apparatus of claim 24, wherein said mixture contains an antioxidant derived from 1,2,dihydro-2,2,4-trimethyquinoline.

26. The apparatus of claim 15, wherein said e-beam coating is less than about 500 nm.

27. The apparatus of claim 15, wherein said contacting of developer and coating is effected at spin speeds of about 500 RPM or less.

28. The apparatus of claim 15, further depositing on said substrate at least one material selected from the group consisting of: a metal, silicon dioxide, silicon nitride, polymer and mixtures thereof.

29. The apparatus of claim 15, wherein said apparatus is a multi-level nano-scale interconnect apparatus.

* * * * *